US012805241B2

(12) United States Patent
Shimada et al.

(10) Patent No.: US 12,805,241 B2
(45) Date of Patent: Nov. 17, 2026

(54) COOLING METHOD, A METHOD OF MANUFACTURING A SEMICONDUCTOR DEVICE AND A NON-TRANSITORY COMPUTER-READABLE RECORDING MEDIUM

(71) Applicant: KOKUSAI ELECTRIC CORPORATION, Tokyo (JP)

(72) Inventors: Hironori Shimada, Toyama (JP); Daiki Kamimura, Toyama (JP); Tomoshi Taniyama, Toyama (JP); Tomoki Matsunaga, Toyama (JP); Yasunori Ejiri, Toyama (JP); Masakazu Sakata, Toyama (JP); Mamoru Ohishi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 971 days.

(21) Appl. No.: 17/703,467

(22) Filed: Mar. 24, 2022

(65) Prior Publication Data

US 2022/0310420 A1 Sep. 29, 2022

(51) Int. Cl.
*H10P 72/00* (2026.01)
*H10P 72/10* (2026.01)

(52) U.S. Cl.
CPC ...... *H10P 72/0434* (2026.01); *H10P 72/0602* (2026.01); *H10P 72/14* (2026.01)

(58) Field of Classification Search
CPC ......... H01L 21/67109; H01L 21/67248; H01L 21/6732; H01L 21/67303; H01L 21/67781; H01L 21/67757; H01L 21/67098; H01L 21/67265
See application file for complete search history.

(56) References Cited

U.S. PATENT DOCUMENTS

| | | | | |
|---|---|---|---|---|
| 9,039,411 | B2 * | 5/2015 | Kadobe | C23C 16/303 432/247 |
| 10,184,177 | B2 * | 1/2019 | Yahata | C23C 16/4408 |
| 11,300,456 | B2 | 4/2022 | Osaka et al. | |
| 2010/0193154 | A1 * | 8/2010 | Aderhold | H01L 21/67109 165/61 |
| 2012/0214317 | A1 * | 8/2012 | Murobayashi | C23C 16/4408 118/724 |

(Continued)

FOREIGN PATENT DOCUMENTS

| | | | | |
|---|---|---|---|---|
| CN | 101324470 B * | 3/2011 | | G01J 5/00 |
| CN | 102653883 A * | 9/2012 | | C23C 16/325 |

(Continued)

OTHER PUBLICATIONS

Japanese Office Action issued on Feb. 14, 2023 for Japanese Patent Application No. 2021-051118.

(Continued)

*Primary Examiner* — Mohammed Shamsuzzaman
(74) *Attorney, Agent, or Firm* — Volpe Koenig

(57) ABSTRACT

A cooling method is a method of cooling a processed substrate in a state of being held by a substrate holder, the method including: a first cooling step of cooling the substrate by supplying a gas toward the substrate holder disposed at a reference position; a stopping step of stopping supply of the gas; and a second cooling step of cooling the processed substrate held in a lower portion of the substrate holder.

18 Claims, 10 Drawing Sheets

(56) References Cited

U.S. PATENT DOCUMENTS

| | | | | |
|---|---|---|---|---|
| 2019/0019705 | A1* | 1/2019 | Nakada | C23C 16/45578 |
| 2019/0067055 | A1* | 2/2019 | Zheng | H01L 21/67754 |
| 2021/0249295 | A1* | 8/2021 | Takeda | C23C 14/35 |

FOREIGN PATENT DOCUMENTS

| | | | | | |
|---|---|---|---|---|---|
| CN | 101661874 | B | * | 4/2013 | H01L 21/67098 |
| CN | 106133874 | A | * | 11/2016 | H01L 21/67109 |
| CN | 106409731 | A | | 2/2017 | |
| CN | 108335998 | A | | 7/2018 | |
| CN | 108885993 | A | | 11/2018 | |
| CN | 112151411 | A | * | 12/2020 | H01L 21/67011 |
| CN | 113281304 | A | * | 8/2021 | C30B 33/02 |
| CN | 215266192 | U | * | 12/2021 | H01L 21/268 |
| JP | 06-037044 | A | | 2/1994 | |
| JP | 2005-197373 | A | | 7/2005 | |
| JP | 2008-103707 | A | | 5/2008 | |
| JP | 2012-169367 | A | | 9/2012 | |
| JP | 2012174782 | A | * | 9/2012 | C23C 16/325 |
| JP | 2012195570 | A | * | 10/2012 | H01L 21/67109 |
| JP | 2013153110 | A | * | 8/2013 | H01L 21/67109 |
| JP | 2013201288 | A | * | 10/2013 | H01L 21/67109 |
| JP | 2015-002339 | A | | 1/2015 | |
| JP | 2018-125439 | A | | 8/2018 | |
| JP | 2018152472 | A | * | 9/2018 | H01L 21/67017 |
| JP | 2019047111 | A | * | 3/2019 | H01L 21/02 |
| JP | 2020088124 | A | * | 6/2020 | H01L 21/67109 |
| KR | 10-2019-0024781 | A | | 3/2019 | |
| KR | 10-2021-0066769 | A1 | | 6/2021 | |
| WO | WO-2004008052 | A2 | * | 1/2004 | C23C 16/4401 |
| WO | WO-2010026772 | A1 | * | 3/2010 | C23C 14/541 |
| WO | WO-2015146161 | A1 | * | 10/2015 | H01L 21/3247 |
| WO | WO-2017163376 | A1 | * | 9/2017 | C23C 16/45578 |
| WO | WO-2019180966 | A1 | * | 9/2019 | H01L 21/67109 |

OTHER PUBLICATIONS

Korean Office Action issued on Jan. 24, 2024 for Korean Patent Application No. 10-2022-0014175.

Singapore Search Report and Written Opinion dated Jun. 16, 2023 for Singapore Patent Application No. 10202201034R.

Chinese Office Action issued on Feb. 15, 2025 for Chinese Patent Application No. 202210172166.6.

Chinese Office Action issued on Sep. 20, 2025 for Chinese Patent Application No. 202210172166.6.

Korean Office Action issued on Apr. 1, 2025 for Korean Patent Application No. 10-2024-7005780.

* cited by examiner

COOLING METHOD, A METHOD OF MANUFACTURING A SEMICONDUCTOR DEVICE AND A NON-TRANSITORY COMPUTER-READABLE RECORDING MEDIUM

CROSS-REFERENCE TO RELATED PATENT APPLICATION

This non-provisional U.S. patent application claims priorities under 35 U.S.C. § 119 of Japanese Patent Application No. 2021-051118, filed on Mar. 25, 2021, in the Japanese Patent Office, the entire contents of which are hereby incorporated by reference.

FIELD

The present disclosure relates to a cooling method of cooling a substrate, a method of manufacturing a semiconductor device, and a non-transitory computer-readable recording medium.

DESCRIPTION OF THE RELATED ART

Generally, in a vertical substrate processing apparatus used in a step of manufacturing a semiconductor device, a transfer chamber is disposed adjacent to a process chamber for processing a substrate. The substrate processed in the process chamber is lowered to a predetermined temperature in a state of being held by a substrate holder in the transfer chamber.

For example, according to related art, the processed substrate may be cooled in a state of being held by the substrate holder in the transfer chamber.

However, when the substrate is held in the lower portion of the substrate holder, the substrate may be reheated by radiant heat from components in the vicinity of the substrate. Therefore, a cooling time of lowering the temperature of the substrate to the predetermined temperature may be lengthened. As a result, a transfer operation of the substrate may be delayed.

SUMMARY

The present disclosure provides a technique capable of shortening a cooling time for a processed substrate.

According to one aspect of the present disclosure, there is provided a technique of cooling processed substrates in a state of being held by a substrate holder, the technique including: a first cooling step of cooling the substrate by supplying a gas toward the substrate holder disposed at a predetermined reference position; a stopping step of stopping supply of the gas; and a second cooling step of cooling the substrate held in a lower portion of the substrate holder.

DETAILED DESCRIPTION

Figure 1:
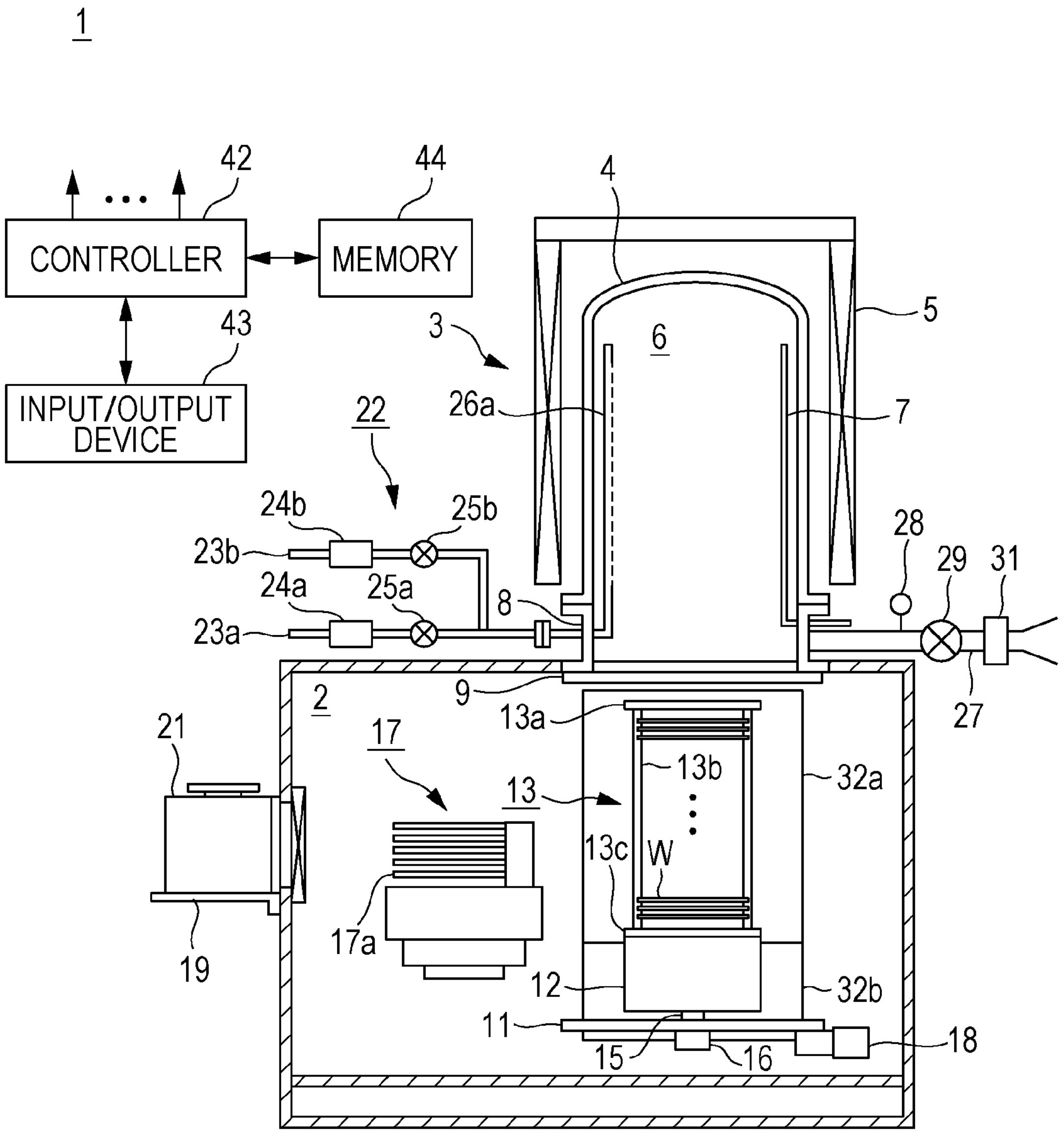
FIG. 1 is a longitudinal sectional view illustrating a schematic configuration of a processing apparatus according to one or more embodiments of the present disclosure.

Hereinafter, one or more embodiments (also simply referred to as "embodiments") according to the technique of the present disclosure will be described with reference to the drawings. Note that the drawings used in the following descriptions are all schematic. For example, dimensional relationships between elements, ratios between the elements, and the like illustrated in the drawings do not always match with actual ones. In addition, the dimensional relationships between the elements, the ratios between the elements, and the like do not always match with each other between the plurality of drawings. In all the drawings, the same or corresponding components are denoted by the same or corresponding reference numerals, and redundant description may be omitted.

In the present embodiments, a substrate processing apparatus is configured as a vertical substrate processing apparatus (hereinafter, referred to as a processing apparatus) 1 capable of performing a substrate processing such as a heat treatment process. The substrate processing is performed as a part of a manufacturing process in a method of manufacturing a semiconductor device (device). As shown in FIG. 1, the process apparatus 1 includes a transfer chamber 2 and a process furnace 3 disposed above the transfer chamber 2.

The process furnace 3 includes a cylindrical reaction tube 4, and a heater 5 as a first heating structure (heater) installed around the reaction tube 4. The reaction tube 4 is made of a heat resistant material such as quartz or silicon carbide (SiC). A process chamber 6 in which a wafer W serving as a substrate is processed is provided in the reaction tube 4. A temperature detector 7 as a temperature detecting structure is installed in the reaction tube 4.

A cylindrical manifold 8 is coupled to a lower end opening of the reaction tube 4 via a seal member such as an O-ring, and the manifold 8 is configured to support a lower end of the reaction tube 4. For example, the manifold 8 is made of a metal such as stainless steel. The lower end opening of the manifold 8 is opened or closed by a disk-shaped shutter 9 or a lid 11. For example, the lid 11 is made of a metal and is formed in a disk shape. A seal member such as an O-ring is installed on upper surfaces of the shutter 9 and the lid 11 so that an inner atmosphere of the reaction tube 4 is hermetically sealed from an outside atmosphere.

A boat 13 serving as a substrate holder is installed on the lid 11. A heat insulator 12 is provided below the boat 13. For example, the heat insulator 12 is made of quartz. A substrate holding region of the boat 13 is provided above the heat insulator 12. The boat 13 is constituted by a top plate 13*a*, a bottom plate 13*c*, and a plurality of columns 13*b* installed between the top plate 13*a* and the bottom plate 131*c*. For example, the boat 13 is configured to support a plurality of wafers including the wafer W in a multistage manner by placing the plurality of wafers including the wafer W in a plurality of grooves provided at the plurality of support columns 131*b*. Hereinafter, the plurality of wafers including the wafer W may also be simply referred to as wafers W. For example, the boat 13 is made of a heat resistant material such as quartz and SiC. When the wafers W are processed, the boat 13 is housed in the process chamber 6. Note that the heat insulator 12 may form a heat insulating region, and the heat insulator 12 may be provided as a separate body from the boat 13.

Figure 3A:
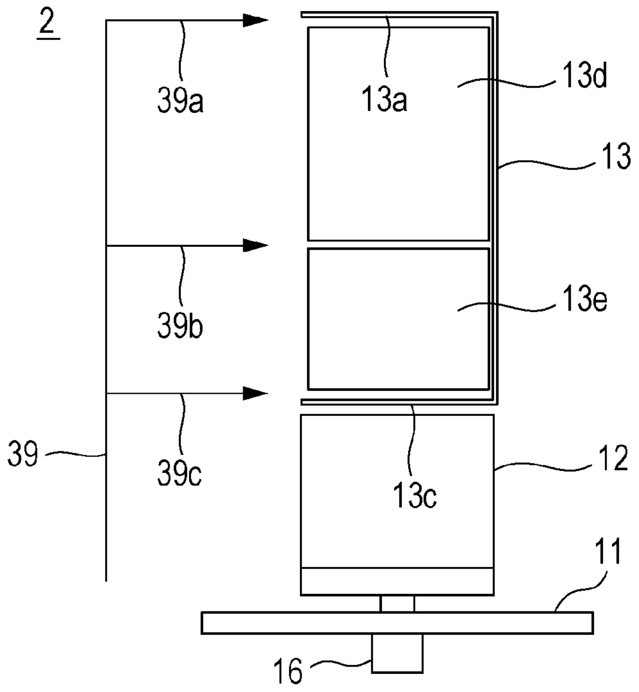
FIG. 3A is a longitudinal sectional view of the transfer chamber illustrating a case where a boat is located at a reference position.
Figure 3B:
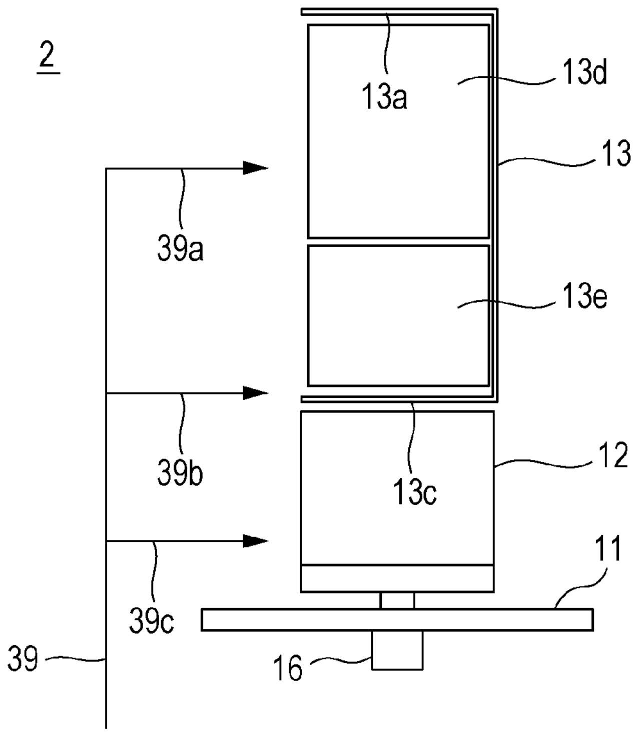
FIG. 3B is a longitudinal sectional view of the transfer chamber illustrating a case where the boat is located at a raised position.

As illustrated in FIGS. 3A and 3B, the substrate holding region of the boat 13 may be divided into two areas of an upper substrate holding region 13*d* and a lower substrate holding region 13*e* adjacent to the upper substrate holding region 13*d*, and the wafers W may be loaded and held in each of the upper substrate holding region 13*d* and other wafers among the wafers W may be loaded and held in each of the lower substrate holding region 13*e*.

The heat insulator 12 is connected to a rotation shaft 15 penetrating the lid 11. The rotation shaft 15 is connected to a rotator 16 installed below the lid 11. By rotating the rotation shaft 15 by the rotator 16, it is possible to rotate the heat insulator 12 and the boat 13.

In the transfer chamber 2, a substrate transfer machine 17, the boat 13, and a boat elevator 18 serving as an elevating structure are arranged. The substrate transfer machine 17 includes an arm (tweezer) 17*a* capable of taking out, for example, five wafers including the wafer W. The substrate transfer machine 17 is configured to be able to transfer the wafers W between a pod 21 placed at a position of a pod opener 19 and the boat 13 by rotating the tweezer 17*a* by a driving structure (not illustrated). The substrate transfer machine 17 is configured to be able to perform wafer mapping. Here, the wafer mapping refers to an operation of checking the presence or absence of the wafer and/or checking a placement state of the wafer. In particular, since sensors (for example, light emitter, light receiver) are provided on left and right sides of a front end of the tweezer 17*a* of the substrate transfer machine 17, it is possible to detect the presence or absence of the wafer by passing an arc of the wafer W between the sensors. In addition, it is possible to detect the placement state (posture) of the wafer W by performing measurement by placing the sensors at three consecutive positions close to the wafer W.

The boat elevator 18 loads and unloads the boat 13 into and from the reaction tube 4 by moving the lid 11 up and down. In addition, the boat elevator 18 is configured to be able to move the boat 13 up and down so that the boat 13 can be held at a reference position (which is a first cooling position) and a raised position (which is a second cooling position) described later. A configuration of the transfer chamber 2 will be described later in detail. Note that the raised position serves as a transfer reference position when transfer of the wafers W by the substrate transfer machine 17 is started by taking out the wafer W accommodated in the boat 13 by the substrate transfer device 17.

The processing apparatus 1 includes a gas supplier (which is a gas supply structure or a gas supply system) 22 that supplies a gas used for substrate processing to the process chamber 6. The gas supplied by the gas supplier 22 may be appropriately changed depending on a type of a film to be formed by the substrate processing. The gas supplier 22 may include a source gas supplier (which is a source gas supply structure (or system)), a reactant gas supplier (reactant gas supply structure (or system)), and an inert gas supplier (inert gas supply structure (or system)).

The source gas supplier includes a supply pipe 231*a*. A mass flow controller (MFC) 24*a* serving as a flow rate controlling structure (flow rate controller) and a valve 25*a* serving as an on-off valve (an opening/closing valve) are sequentially provided at the gas supply pipe 23*a* in this order from the upstream side to a downstream side of the gas supply pipe 23*a* in a gas flow direction. The supply pipe 23*a* is connected to a nozzle 26*a* penetrating the side wall of the manifold 8. The nozzle 26*a* extends in the reaction tube 4 along the vertical direction, and the nozzle 26*a* is provided with a plurality of supply holes opened toward the wafers W held by the boat 13. A source gas is supplied to the wafer W through the plurality of supply holes of the nozzle 26*a*.

A reactive gas is supplied to the wafers W through a reactant gas supplier whose configuration is similar to that of the source gas supplier via the supply pipe 23*a*, the MFC 24*a*, the valve 25*a*, and the nozzle 261*a*. An inert gas is supplied to the wafers W through the inert gas supplier whose configuration is similar to that of the source gas supplier via a supply pipe 23*b*, an MFC 24*b*, a valve 25*b*, and the nozzle 26*a*.

An exhaust pipe 27 is attached to the manifold 8. A vacuum pump 31 serving as a vacuum exhaust device is connected to the exhaust pipe 27 via a pressure sensor 28 serving as a pressure detecting structure (pressure detector) to detect an inner pressure of the process chamber 6 and an auto pressure controller (APC) valve 29 serving as a pressure regulating structure (pressure regulator). With such a configuration, it is possible to set (or adjust) the inner pressure of the process chamber 6 to a process pressure corresponding to the processing.

Next, in FIGS. 1 to 3B, a configuration of the transfer chamber 2 according to the present embodiments will be described.

Figure 2:
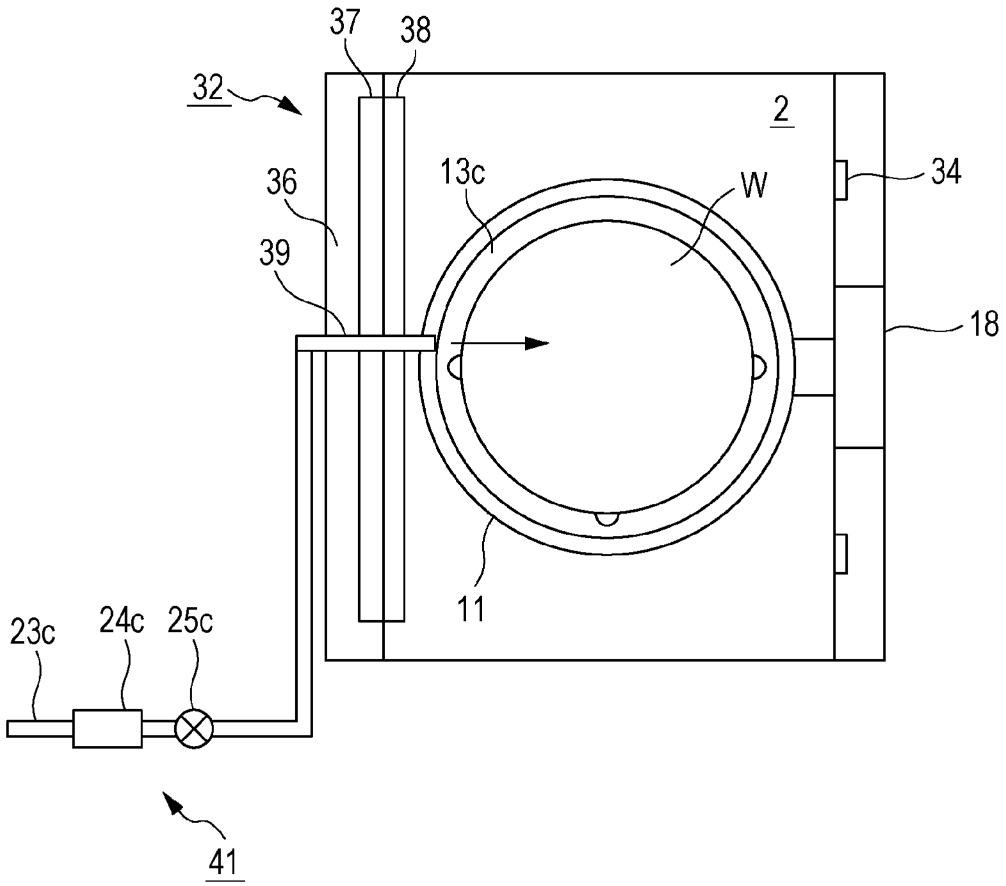
FIG. 2 is a transverse sectional view illustrating a schematic configuration of a transfer chamber of the substrate processing apparatus according to the embodiments of the present disclosure.

As illustrated in FIG. 2, the transfer chamber 2 is made of a planar polygonal shape configured by a ceiling, a bottom, and side walls surrounding four sides of the transfer chamber 2. For example, the transfer chamber 2 is of a planar rectangular shape. A clean air supplier (which is a clean air supply structure (or system) 32 serving as a first blower (first gas supplier) is installed on a side surface of the transfer chamber 2. The first blower may also be referred to as a "first gas supplier" (which is a first gas supply structure or a first gas supply system). The clean air supplier 32 is configured to supply a gas such as a clean air (clean atmosphere) to the transfer chamber 2. A circulation path (not illustrated) for circulating the gas is provided in a space located around the transfer chamber 2. The gas supplied to the transfer chamber 2 is exhausted from an exhauster 34, and is supplied to the transfer chamber 2 again through the clean air supplier 32 via the circulation path. A radiator is installed in the middle of the circulation path, and the gas is cooled by passing through the radiator.

The clean air supplier 32 is disposed such that an upper clean air supplier 32*a* and a lower clean air supplier 32*b* are vertically adjacent to each other. The upper clean air supplier 32*a* is configured to supply the gas toward the transfer chamber 2, particularly toward the boat 13. The lower clean air supplier 32*b* is configured to supply the gas into the transfer chamber 2, particularly toward the heat insulator 12. Hereinafter, the term "clean air supplier 32" may refer to the upper clean air supplier 32*a* alone, may refer to the lower clean air supplier 32*b* alone, or may refer to both of the upper clean air supplier 32*a* and the lower clean air supplier 32*b*.

The clean air supplier 32 includes, in order from the upstream side to a downstream side of the clean air supplier 32 in the gas flow direction, a fan (not illustrated) as a blower, a buffer area 36 as a buffer chamber, a filter structure 37 such as a filter, and a gas supply port 38. The buffer area 36 serves as a diffusion space of the gas (that is, the clean air) through which the gas is uniformly supplied (or ejected) via an entire surface of the gas supply port 38. The filter 37 is configured to remove particles contained in the gas. The fan, the buffer area 36, the filter 37, and the gas supply port 38 are included in each of the clean air supplier 32*a* and 32*b*.

The exhauster 34 and the boat elevator 18 are installed on one side surface of the transfer chamber 2 facing the clean air supplier 32. The gas supplied into the transfer chamber 2 through the clean air supplier 32 is exhausted from the exhauster 34, and is supplied again from the clean air supplier 32 via the circulation path. As a result, a gas flow (which is a side flow) in the horizontal direction (direction parallel to the wafer W) is formed in an upper region (also referred to as a wafer W region) in the transfer chamber 2.

As illustrated in FIG. 2, and FIGS. 3A and 3B, a cooling gas nozzle 39 as a second blower is installed on the side surface on which the clean air supplier 32 is installed. The second blower may also be referred to as a "second gas supplier" (which is a second gas supply structure (or system)). According to the present embodiments, the cooling gas nozzle 39 is installed in the transfer chamber 2 such that the boat 13 is located between the cooling gas nozzle 39 and the boat elevator 18, and extends upward (in a stacking direction of the wafers W).

The cooling gas nozzle 39 includes a first branch nozzle 39*a* that is bent and extends toward the boat 13, a second branch nozzle 39*b* that extends toward the boat 13 on the upstream side of the first branch nozzle 39*a*, and a third branch nozzle 39*c* that extends toward the boat 13 on the upstream side of the second branch nozzle 39*b*, and a cooling gas is supplied to the transfer chamber 2, particularly, the substrate holding region via each of the branch nozzles 39*a* to 39*c*. Preferably, each of the branch nozzles 39*a* to 39*c* are configured to supply the gas toward a region between the top plate 13*a* of the boat 13 and the uppermost wafer among the wafers W in the upper substrate holding region 13*d*, and a region between the bottom plate 13*c* of the boat 13 and a lowermost wafer among the wafers W in the lower substrate holding region 13*e*.

The cooling gas nozzle 39 is connected to a transfer chamber gas supplier (which is a transfer chamber gas supply structure (or system)) 41 for supplying the cooling gas to the transfer chamber 2. The transfer chamber gas supplier 41 is constituted by a gas supply pipe 23*c*, and an MFC 24*c* and a valve 25*c* are sequentially provided at the gas supply pipe 23*c* in this order from an upstream side to a downstream side of the gas supply pipe 23*c* in the gas flow direction. Note that the cooling gas nozzle 39, each of the branch nozzles 39*a* to 39*c*, and the transfer chamber gas supply mechanism 41 function as a cooling structure (also referred to as a "cooler") for cooling the processed wafers W held by the boat 13.

The boat elevator 18 can hold the boat 13 at either a reference position at which a first cooling step is executed as illustrated in FIG. 3A or a raised position at which a second cooling step is executed as illustrated in FIG. 3B. The raised position is located above the reference position. With the boat 13 placed at the reference position, the cooling gas jetting out from the first branch nozzle 39*a* is supplied to the region between the top plate 13*a* and the uppermost wafer among the wafers W in the upper substrate holding region 13*d*, and the cooling gas jetting out from the third branch nozzle 39*c* is supplied to the region between the bottom plate 13*c* and the lowermost wafer among the wafers W in the lower substrate holding region 131*e*. In addition, with the boat 13 placed in the raised position, the cooling gas jetting out from the second branch nozzle 39*b* is supplied to the region between the bottom plate 13*c* and the lowermost wafer among the wafers W in the lower substrate holding region 131*e*. As a result, it is possible to provide a cooling gas barrier (gas curtain) between the bottom plate 13*c* and the lowermost wafer among the wafers W in the lower substrate holding region 131*e*. Thus, it is possible to cool the wafers W held in a lower portion of the boat 13, and it is also possible to separate an atmosphere in the wafer W region from an atmosphere of a region corresponding to the heat insulator 12 by the gas curtain.

As illustrated in FIGS. 1 to 3B, a controller 42 is connected to and controls the rotation mechanism 16, the substrate transfer machine 17, the boat elevator 18, the gas supplier 22 (MFCs 24*a* and 24*b* and valves 25*a* and 25*b*), the APC valve 29, the clean air supplier 32, and the transfer chamber gas supplier 41 (the MFC 24*c* and the valve 25*c*). The controller 42 includes, for example, a microprocessor (computer) including a CPU (Central Processing Unit), and is configured to be capable of controlling operations of the processing apparatus 1. An input/output device 43 configured as, for example, a touch panel is connected to the controller 42.

A memory 44 as a storage medium is connected to the controller 42. The memory 44 readably stores a control program for controlling the operation of the processing apparatus 1 and a program (for example, recipe such as a process recipe or a cleaning recipe) for causing each component of the processing apparatus 1 to execute processing depending on a processing condition.

The memory 44 may be a storage device (a hard disk or a flash memory) built in the controller 42, or may be an external recording media (a semiconductor memory such as a USB memory or a memory card). Alternatively, the program may be provided to the computer by using a communication means such as the Internet or a dedicated line. The program is read from the memory 44 by an instruction or the like from the input/output device 43 as necessary, and the processing apparatus 1 executes desired process (that is, a substrate processing) in accordance with the read recipe under the control of the controller 42.

Next, a description will be given of processing (film forming processing) of forming a film on a substrate by using the above-described processing apparatus 1. Here, a description will be given of an example of forming the film on the wafer W by supplying a source gas and a reactant gas to the wafer W. Note that, in the following description, the operations of the components constituting the substrate processing apparatus 1 are controlled by the controller 42.

(Transfer Step)

The wafers W are transferred from the pod 21 to the boat 13 by the substrate transfer machine 17 (wafer charging step). At this time, the gas (that is, the clean air) is supplied from the clean air supplier 32 to the transfer chamber 2. In addition to the clean air supplier 32, the cooling gas may be supplied from each of the branch nozzles 39*a* to 39*c* via the cooling gas nozzle 39.

(Loading Step)

Next, the shutter 9 closing a wafer loading/unloading port in a lower portion of the process chamber 6 is retracted to a shutter housing (not illustrated), and the wafer loading/unloading port of the process chamber 6 is opened. Subsequently, the lid 11 is raised by the boat elevator 18, and the boat 13 is loaded into the process chamber 6 from the transfer chamber 2 (boat loading step). As a result, the lid 11 seals the lower end (that is, the lower end opening) of the manifold 8 via a seal. At this time, the gas is continuously supplied from the clean air supplier 32 to the transfer chamber 2 under the same conditions as in the transfer step.

(Substrate Processing Step)

After the boat 13 is loaded into the process chamber 6, an atmosphere of the process chamber 6 is exhausted through the exhaust pipe 27 to set the pressure in the process chamber 6 to a desired pressure (degree of vacuum). In addition, the process chamber 6 is heated by the heater 5, and the boat 13 is rotated by operating the rotator 16. Further, the source gas and the reactant gas are supplied to the process chamber 6 by the gas supplier 22. As a result, a film is formed on the surface of the wafer W. When the film of a desired thickness is formed on the surface of the wafer W, the gas supplier 22 stops supplying the source gas and the reactant gas to the process chamber 6 and supplies the inert gas to the process chamber 6. As a result, the atmosphere of the process chamber 6 is replaced with the inert gas, and the pressure of the process chamber 6 is returned to a normal pressure. At this time, in the transfer chamber 2, the gas is continuously supplied from the clean air supplier 32 to the transfer chamber 2 under the same conditions as in the transfer step.

(Unloading Step)

After the substrate processing step is completed, the lid 11 is lowered by the boat elevator 18 to open the lower end of the manifold 8, and the boat 13 is unloaded from the process chamber 6 to the transfer chamber 2. Then, the wafer loading/unloading port of the process chamber 6 is closed by the shutter 9, and the boat 13 is disposed at the reference position (boat unloading step). At this time, the gas is continuously supplied from the clean air supplier 32 or from the clean air supplier 32 and the cooling gas nozzle 39 to the transfer chamber 2 under the same conditions as in the transfer step.

(Temperature Lowering Step)

Figure 4:
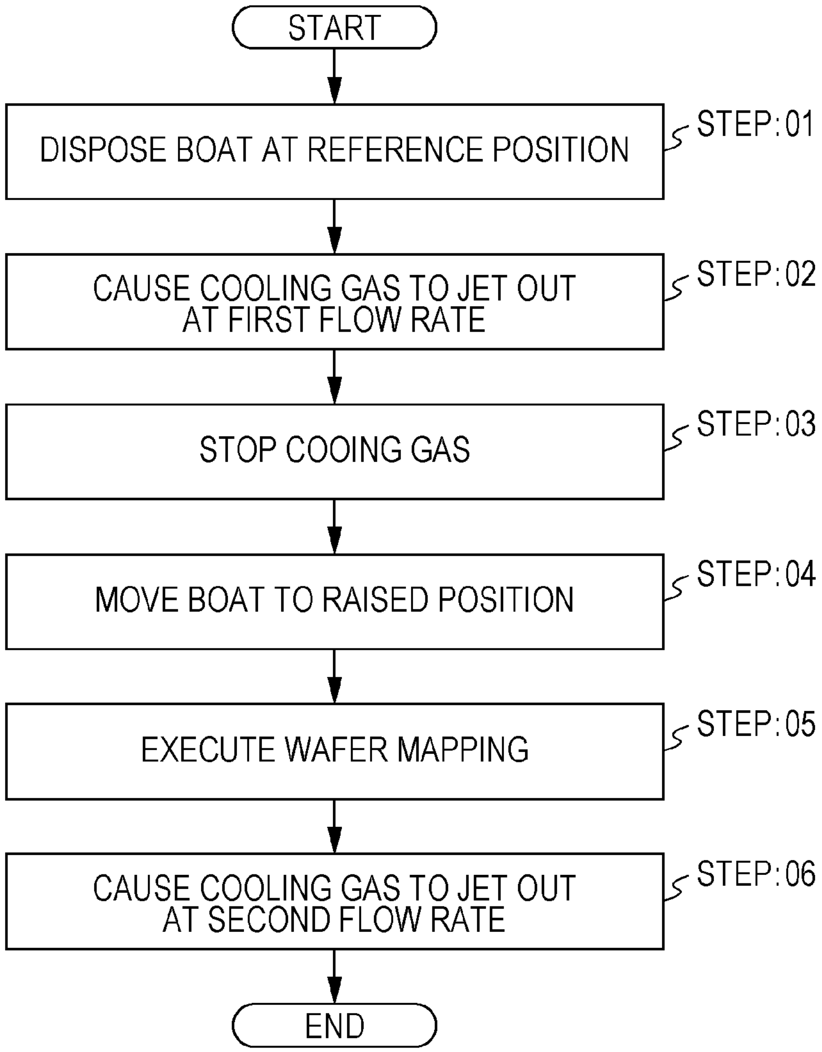
FIG. 4 is a flowchart schematically illustrating a cooling step of cooling a processed wafer in the transfer chamber according to the embodiments of the present disclosure.

When the boat 13 is completely transferred (unloaded) to the transfer chamber 2, a temperature lowering step (cooling step) of lowering the temperature of the wafers W (or cooling the wafer W) in the transfer chamber 2 is executed until the temperature of the wafers W reaches and is maintained at a pre-set temperature. Here, the term "pre-set temperature" refers to a temperature at which the wafers W can be unloaded, and is stored in the memory 44 in advance. The pre-set temperature is a temperature lower than or equal to a heat resistance temperature of the tweezer 17*a* or the pod 21, and for example, is set to 100° C. Note that the pre-set temperature may usually be set in a range of higher than or equal to 60° C. and lower than or equal to 100° C. depending on a material of the tweezer 17*a* or the pod 21. Hereinafter, the cooling step of cooling the wafers W will be described in detail with reference to a flowchart of FIG. 4. Steps S01 through S06 are performed as the cooling step.

<Step S01>

When the substrate processing in the process chamber 6 is completed, the controller 42 drives the boat elevator 18 to lower the boat 13 to the reference position. At this time, the gas is supplied to the clean air supplier 32 at a predetermined flow rate. Note that, in the present embodiments, the boat 13 is lowered from the process chamber 6 to move to the reference position, but the boat 13 may be further moved and arranged at the reference position after being lowered. In addition, in the step of STEP: S01, the cooling gas nozzle 39 may also be configured to supply the cooling gas toward the boat 13 at a predetermined flow rate.

<Step S02>

When the boat 13 is disposed at the reference position, the controller 42 controls the MFC 24*c* and the valve 25*c* such that the cooling gas jets out from each of the branch nozzles 39*a* to 39*c* at a first flow rate for a first cooling time. With the boat 13 at the reference position, the cooling gas jetting out from the first branch nozzle 39*a* flows between the top plate 13*a* of the boat 13 and the uppermost wafer among the wafers W in the upper substrate holding region 131*d*. The cooling gas jetting out from the third branch nozzle 39*c* flows between the bottom plate 13*c* of the boat 13 and the lowermost wafer among the wafers W in the lower substrate holding region 131*e*. The wafers W loaded in the boat 13 are cooled by the cooling gas flowing in from each of the branch nozzles 39*a* to 39*c*. In addition, the gas curtain is formed between the boat 13 and the heat insulator 12, so that the wafers among the wafers W in the lower portion of the boat 13 can be cooled and radiant heat from the heat insulator 12 can be blocked.

Here, for example, the first flow rate is set to 75 L/min. The first cooling time refers to a time until the temperature of the wafers W loaded in the boat 13 becomes lower than or equal to 100° C., and is set in advance in accordance with conditions such as a process temperature of the wafers W and the first flow rate. Note that the Step S01 and the Step S02 may be collectively referred to as the first cooling step.

<Step S03>

After the cooling gas jets out from each of the branch nozzles 39*a* to 39*c* for the first cooling time, the controller 42 controls the MFC 24*c* and the valve 25*c* to stop the supply of the cooling gas.

<Step S04>

The controller 42 drives the boat elevator 18 to raise the boat 13 to the raised position. At this time, the supply of the cooling gas from each of the branch nozzles 39*a* to 39*c* is stopped. Note that the step of moving the boat 13 from the reference position to the raised position may also be referred to as a moving step, Step S04.

<Step S05>

With the supply of the cooling gas is stopped, the controller 42 executes an operation of mapping the wafers W (that is, the wafer mapping described above). That is, the controller 42 operates the substrate transfer machine 17, and confirms a transfer state (or the placement state) of the wafers W held by the boat 13 by a sensor (hereinafter, sometimes referred to as a wafer sensor) provided in the substrate transfer machine 17 in advance. Specifically, while moving the substrate transfer machine 17 up and down, the controller 42 confirms whether or not an abnormality such as a protruding, a cracking, or a placement deviation has occurred based on information from the sensor. Further, the substrate transfer machine 17 may be provided with a temperature sensor as a temperature measuring structure described later to measure the temperature of the wafers W held by the boat 13. An operation of measuring of the temperature measurement of the wafer W or the confirmation of the transfer state of the wafers W held by the boat 13 may be executed, or both of the operation of measuring the temperature of the wafer W and the operation of checking the transfer state of the wafer W accommodated in the boat 13 may be performed. The wafer sensor and the temperature sensor described above are sensors capable of measuring an object (that is, the wafer W) without contacting the object (that is, in a non-contact manner). but an attachment position of each of the wafer sensor and the temperature sensor described above is not particularly limited to the present embodiments.

In the present embodiments, Step S03 to Step S05 may be collectively referred to as a stopping step. In the stopping step, the controller 42 starts, for example, the wafer mapping when a pre-set time has elapsed after the first cooling step is completed. When the boat 13 is completely raised to the raised position before the pre-set time has elapsed, the boat 13 is held at the raised position. When the boat 13 is not completely raised to the raised position even after the pre-set time has elapsed, the controller 42 determines that there is an abnormality and performs notification of an alarm. Note that, when the boat 13 is completely raised to the raised position before the pre-set time has elapsed, it is not necessary to wait for the elapse of the set time, and the boat 13 may be subjected to the wafer mapping.

After the wafer mapping is performed, the controller 42 confirms whether or not there is an abnormality in the placement state of the wafer W is present, and when an abnormality has occurred, the controller 42 performs notification of an alarm indicating that there is an abnormality. At this time, the substrate processing may be stopped so as not to proceed to a wafer discharging step so that recovery process in response to the abnormality can be performed immediately after the next step (STEP: S06) is completed.

<Step S06>

The controller 42 controls the MFC 24*c* and the valve 25*c* such that the cooling gas jets out from each of the branch nozzles 39*a* to 39*c* at a second flow rate for a second cooling time. With the boat 13 at the raised position, the cooling gas jetting out from the second branch nozzle 39*b* flows between the bottom plate 13*c* of the boat 13 and the lowermost wafer among the wafers W in the lower substrate holding region 131*e*. The wafers W loaded in the boat 13 are cooled by the cooling gas jetting out from the second branch nozzle 39*b*, and the gas curtain is formed between the boat 13 and the heat insulator 12, so that the radiant heat from the heat insulator 12 can be blocked.

Here, for example, the second flow rate is set to 15 L/min that is less than the first flow rate. The second cooling time refers to a time (which is shorter than the first cooling time) until the temperature of the wafer among the wafers W (whose temperature has not been lowered to the pre-set temperature in the first cooling step) that becomes at a temperature lower than or equal to 100° C. The second cooling time may be set in advance in accordance with the conditions such as the process temperature of the wafers W, the first flow rate, the second flow rate. Note that Step S06 may also be referred to as the second cooling step.

Note that all of the branch nozzles 39*a* to 39*c* branch from the cooling gas nozzle 39, and the flow rate of the cooling gas flowing through the cooling gas nozzle 39 is collectively controlled by the MFC 24*c* and the valve 251*c*. That is, the cooling gas is supplied to the three branch nozzles 39*a* to 39*c* in one system. Thus, in the first cooling step in which the boat 13 is located at the reference position, the cooling gas is supplied from the second branch nozzle 39*b* to a middle portion of the substrate holding region at the first flow rate. In addition, in the second cooling step in which the boat 13 is located at the raised position, the cooling gas is supplied from the first branch nozzle 39*a* to the middle portion of the substrate holding region at the second flow rate, and the cooling gas is supplied from the third branch nozzle 39*c* to the heat insulating region of the heat insulator 12 at the second flow rate.

(Transfer Step)

When the wafer W is cooled for a predetermined time, the wafers W are transferred from the boat 13 to the pod 21 by the substrate transfer machine 17 (wafer discharging step). At this time, it may be configured such that the wafers W in the lower substrate holding region 13*e* are discharged at the raised position, the boat 13 may be then lowered to the reference position, and the wafers W in the upper substrate holding region 13*d* are discharged.

Note that, in a case where the transfer step is executed for each type of the wafer W such as a monitor wafer, a product wafer, or a dummy wafer, the boat 13 is moved up and down between the reference position and the raised position each time, and the wafer W is discharged at each position. In the transfer step of discharging the wafer W, the cooling gas is supplied from the clean air supplier 32 at a predetermined flow rate during discharging of the wafer W. In addition, the cooling gas may also be supplied from each of the branch nozzles 39*a* to 39*c* at a predetermined flow rate. On the other hand, while the boat 13 moves up and down, the supply of the cooling gas from each of the branch nozzles 39*a* to 39*c* is stopped.

As described above, in the present embodiments, the cooling gas nozzle 39 through which the cooling gas is supplied is made to branch into the branch nozzles 39*a* to 39*c*, and the cooling gas is supplied between the lowermost wafer W of the boat 13 and the heat insulator 12 from each of the branch nozzles 39*a* to 39*c*, at each of the reference position (at which wafer among the wafers W held in the upper substrate holding region 13*d* is transferred) and the raised position (at which wafer among the wafers W held in the lower substrate holding region 13*e* is transferred).

Thus, in both of the reference position and the raised position, the cooling gas is supplied to a boundary between the heat insulating region and the substrate holding region to form the gas curtain, so that the wafer among the wafers W in the lower portion of the substrate holding region can be cooled, the radiant heat from the heat insulating region can be blocked, and the temperature of the wafers W held in the substrate holding region can be prevented from rising again.

In addition, since the cooling gas can be supplied to a region between the substrate holding region and the top plate 13*a*, a region between the substrate holding region and the bottom plate 13*c*, the middle portion of the substrate holding region, that is, the entire boat 13, via the branch nozzles 39*a* to 39*c*. Therefore, it is possible to shorten the first cooling time, and it is also possible to shorten the time of the first cooling step.

In addition, since the temperature of the wafers W held in the substrate holding region can be prevented from rising again, it is possible to shorten a time for setting the pre-set temperature at which the wafers W can be transferred by the substrate transfer machine 17. As a result, it is possible to start the transfer of the wafers W within a pre-set time, and it is possible to transfer the wafer W without delay.

In addition, the boat 13 can be moved up and down between the reference position and the raised position provided above the reference position, the wafers W held in the upper substrate holding region 13*d* can be transferred by the substrate transfer machine 17 at the reference position, and the wafers W held in the lower substrate holding region 13*e* can be transferred by the substrate transfer machine 17 at the raised position. Thus, all the wafers W held by the boat 13 can be transferred by the substrate transfer machine 17 without changing a structure of the substrate transfer machine 17.

In addition, when the boat 13 is moved from the reference position to the raised position, the wafer mapping can be executed. Thus, after the first cooling step, it is possible to determine presence or absence of abnormality of the wafers W when the boat 13 moves, and it is possible to determine whether or not the wafers W can be transferred.

The flow rate (that is, the second flow rate) of the cooling gas supplied in the second cooling step is less than the flow rate (that is, the first flow rate) of the cooling gas supplied in the first cooling step, and a cooling gas supply time (that is, the second cooling time) in the second cooling step is shorter than a cooling gas supply time (that is, the first cooling time) in the first cooling step. Thus, it is possible to suppress the waste of the cooling gas. Note that, as the cooling gas, an inert gas such as $N_2$ is used.

In addition, in the stopping step, a time from stop of the cooling gas to execution of the wafer mapping is set in advance, and the wafer mapping is started when the pre-set time has elapsed. Thus, by starting the wafer mapping and the transfer of the wafers W from the boat 13 without delay in the pre-set first cooling time, it is possible to check the placement state of the processed wafers W placed on the boat 13 and detect whether or not there is an abnormality in the placement state of the wafers W arranged in the boat 13. Note that the wafer mapping may be performed immediately after the cooling gas is stopped (that is, the pre-set time may be set to zero).

The present embodiments are not limited to the above-described aspect, and can be modified as described below.

Figure 5A:
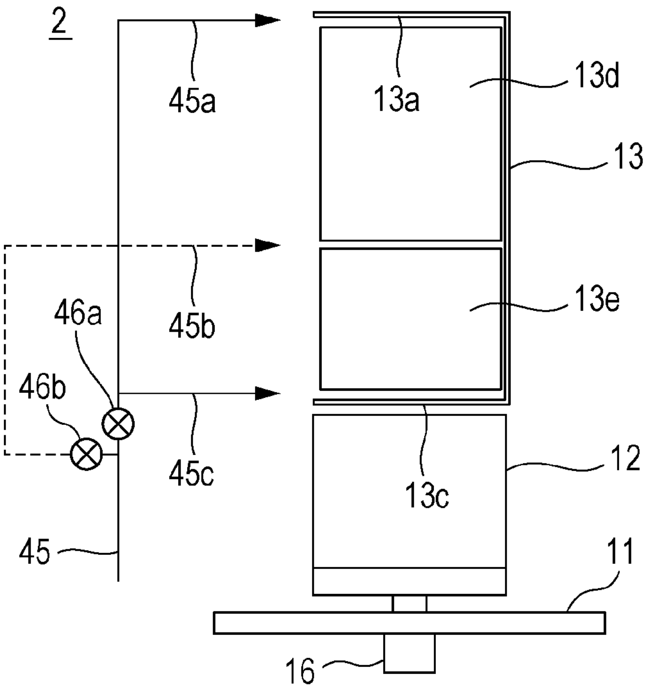
FIGS. 5A and 5B are longitudinal sectional views illustrating a schematic configuration of a transfer chamber according to a first modified example of the embodiments of the present disclosure, wherein FIG. 5A schematically illustrates the transfer chamber when the boat is located at the reference position, and FIG. 5B schematically illustrates the transfer chamber when the boat is located at the raised position.
Figure 5B:
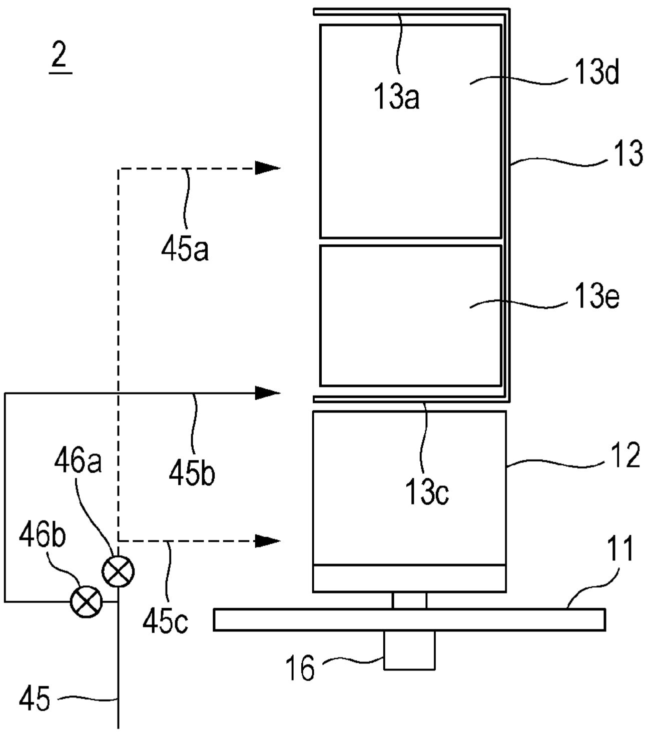

FIGS. 5A and 5B schematically illustrate a first modified example of the present disclosure. In the first modified example, a cooling gas nozzle 45 (which corresponds to the cooling gas nozzle 39 of the embodiments described above) includes a first branch nozzle 45*a* that is bent and extends toward the boat 13, a third branch nozzle 45*c* that branches toward the boat 13 on the upstream side of the first branch nozzle 45*a*, and a switching valve 46*a* provided on the upstream side of the third branch nozzle 451*c*. In addition, the cooling gas nozzle 45 includes a second branch nozzle 45*b* that branches in a predetermined direction on the upstream side of the switching valve 461*a*. The second branch nozzle 45*b* is configured to extend in the predetermined direction and then be bent and extend toward the boat 13, and the second branch nozzle 45*b* is provided with a switching valve 46*b*.

In the first modified example, similarly to the embodiments according to the present disclosure, the cooling gas jetting out from the first branch nozzle 45*a* is supplied between the top plate 13*a* and the uppermost wafer W in the substrate holding region at the reference position. The cooling gas jetting out from the second branch nozzle 45*b* is supplied between the bottom plate 13*c* and the lowermost wafer W in the substrate holding region at the raised position, and the cooling gas jetting out from the third branch nozzle 45*c* is supplied between the bottom plate 13*c* and the lowermost wafer among the wafers W in the substrate holding region at the reference position.

In the first modified example, when the switching valve 46*a* is opened and the switching valve 46*b* is closed, the cooling gas jets out only from the first branch nozzle 45*a* and the third branch nozzle 45*c*, and the cooling gas does not jet out from the second branch nozzle 451*b*. On the other hand, when the switching valve 46*a* is closed and the switching valve 46*b* is opened, the cooling gas jets out only from the second branch nozzle 45*b*, and the cooling gas does not jet out from the first branch nozzle 45*a* and the third branch nozzle 45*c*.

In the first modified example, by opening the switching valve 46*a* and closing the switching valve 46*b* in the first cooling step and by closing the switching valve 46*a* and opening the switching valve 46*b* in the second cooling step, it is possible to reliably supply the cooling gas to the region between the bottom plate 13*c* and the lowermost wafer W in the substrate holding region and it is possible to prevent the cooling gas from jetting out directly to the wafer W. Further, it is possible to suppress the amount of consumption of the cooling gas.

Figure 6A:
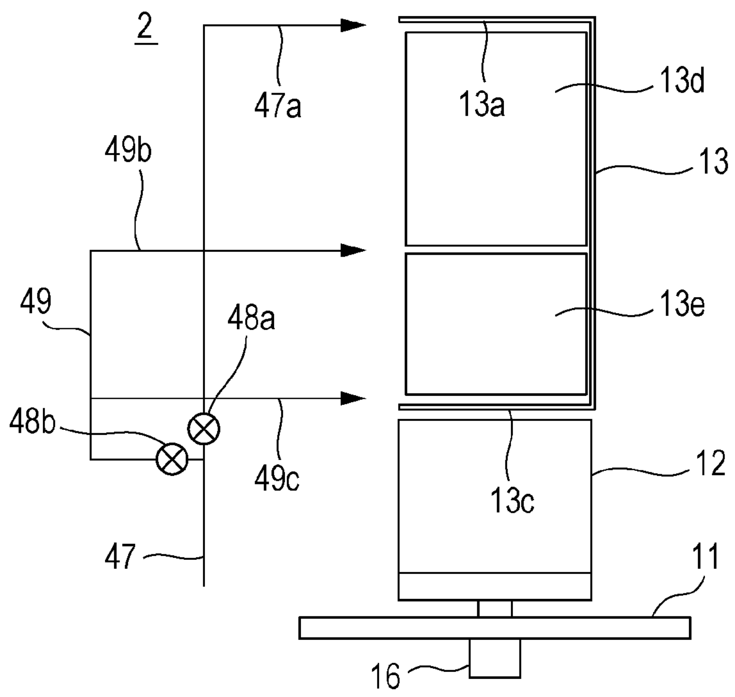
FIGS. 6A and 6B are longitudinal sectional views illustrating a schematic configuration of a transfer chamber of the substrate processing apparatus according to a second modified example of the embodiments of the present disclosure, in which FIG. 6A schematically illustrates the transfer chamber when the boat is located at the reference position, and FIG. 6B schematically illustrates the transfer chamber when the boat is located at the raised position.
Figure 6B:
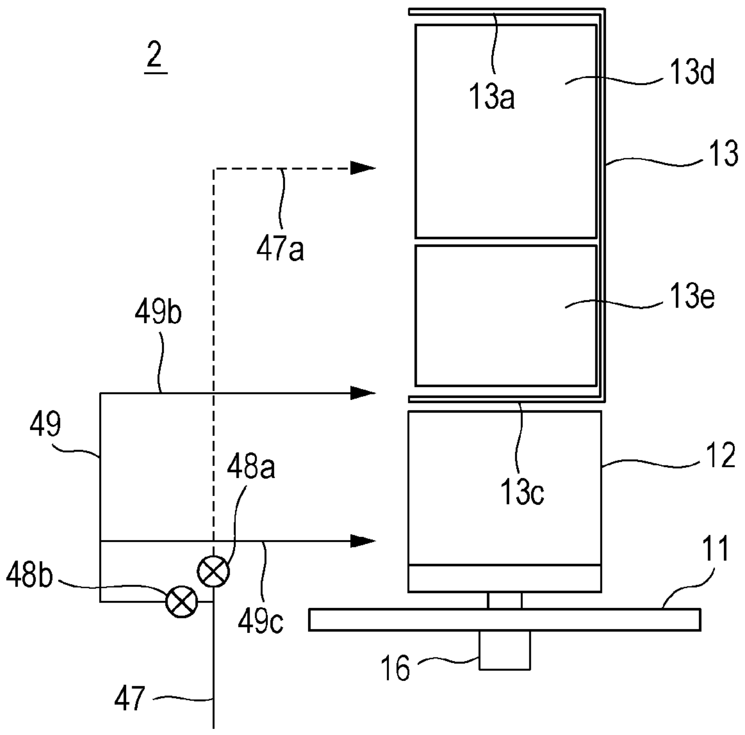

FIGS. 6A and 6B illustrate a second modified example of the embodiments of the present disclosure. In the second modified example, the cooling gas nozzle (which corresponds to the cooling gas nozzle 39 of the embodiments described above) includes a first cooling gas nozzle 47 and a second cooling gas nozzle 49 branching from the first cooling gas nozzle 47. The first cooling gas nozzle 47 includes a first branch nozzle 47*a* that is bent and extends toward the boat 13, and a switching valve 48*a* provided on the upstream side of the first branch nozzle 47*a*, and the second cooling gas nozzle 49 branches in a predetermined direction from the first cooling gas nozzle 47 on the upstream side of the switching valve 48*a*.

The second cooling gas nozzle 49 includes a second branch nozzle 49*b* that is bent and extends toward the boat 13 on the upstream side of the first branch nozzle 47*a*, a third branch nozzle 49*c* that branches toward the boat 13 on the upstream side of the second branch nozzle 49*b*, and a switching valve 48*b* provided on the upstream side of the third branch nozzle 491*c*. That is, the second branch nozzle 49*b* extends from a space between the first branch nozzle 47*a* and the third branch nozzle 49*c* toward the boat 13.

Also in the second modified example, similarly to the embodiments according to the present disclosure, the cooling gas jetting out from the first branch nozzle 47*a* is supplied to a region between the top plate 13*a* and the uppermost wafer among the wafers W in the substrate holding region at the reference position, the cooling gas jetting out from the second branch nozzle 49$b$ is supplied to a region between the bottom plate 13$c$ and the lowermost wafer among the wafers W in the substrate holding region at the raised position, and the cooling gas jetting out from the third branch nozzle 49$c$ is supplied to a region between the bottom plate 13$c$ and the lowermost wafer W in the substrate holding region at the reference position.

In the second modified example, in the first cooling step, the switching valve 48$a$ is opened, and the degree of opening of the switching valve 48$b$ is adjusted so that the flow rate of the cooling gas supplied to the second cooling gas nozzle 49 is less than the flow rate of the cooling gas supplied to the first cooling gas nozzle 47. Note that, the total flow rate of the cooling gas in the first cooling step may be set 75 slm, and the flow rate ratio of the cooling gas between the cooling gas of the first cooling gas nozzle 47 and the cooling gas of the second cooling gas nozzle 49 may be set to 5:1, for example.

In the second cooling step, the switching valve 48$a$ is closed, the switching valve 48$b$ is opened, and the flow rate of the cooling gas is set to be less than the flow rate of the cooling gas in the first cooling step (that is, when the boat is located at the reference position). For example, the total flow rate of the cooling gas in the second cooling step may be set to 15 slm.

In the first cooling step, the cooling gas of a large flow rate is supplied to the region between the top plate 13$a$ and the uppermost wafer among the wafers W in the substrate holding region from the first branch nozzle 47$a$, and the cooling gas of a small flow rate is supplied to the middle portion of the substrate holding region and the region between the bottom plate 13$c$ and the lowermost wafer among the wafers W in the substrate holding region from the branch nozzles 49$b$ and 491$c$. In addition, in the second cooling step, the cooling gas is supplied to the region between the bottom plate 13$c$ and the lowermost wafer among the wafers W in the substrate holding region from the second branch nozzle 49$b$, and the cooling gas is supplied to the heat insulator 12 from the third branch nozzle 49$c$.

In the second modified example, in the first cooling step, the degree of opening of the switching valve 48$b$ is adjusted so that the flow rate of the cooling gas supplied through the second cooling gas nozzle 49 is less than the flow rate of the cooling gas supplied through the first cooling gas nozzle 47, and in the second cooling step, the total flow rate of the cooling gas is set to be less than the total flow rate of the cooling gas in the first cooling step. Thus, in both cases of the first cooling step and the second cooling step, the cooling gas with a reduced flow rate of an approximately same amount is supplied to the region between the bottom plate 13$c$ and the lowermost wafer among the wafers W in the substrate holding region, so that it is possible to suppress the amount of consumption of the cooling gas.

Note that, in the second modified example, the switching valve 48$b$ that adjusts the degree of opening to reduce the flow rate of the cooling gas is provided in the second cooling gas nozzle 49, but an orifice provided with a predetermined flow path resistance may be installed instead of the switching valve 48$b$.

Figure 7A:
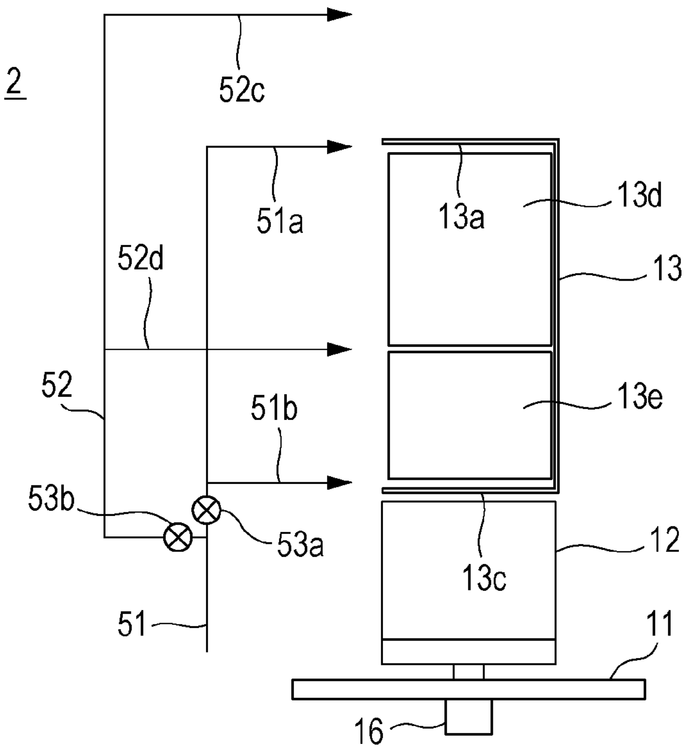
FIGS. 7A and 7B are longitudinal sectional views illustrating a schematic configuration of a transfer chamber of the substrate processing apparatus according to a third modified example of the embodiments of the present disclosure, in which FIG. 7A schematically illustrates the transfer chamber when the boat is located at the reference position, and FIG. 7B schematically illustrates the transfer chamber when the boat is located at the raised position.
Figure 7B:
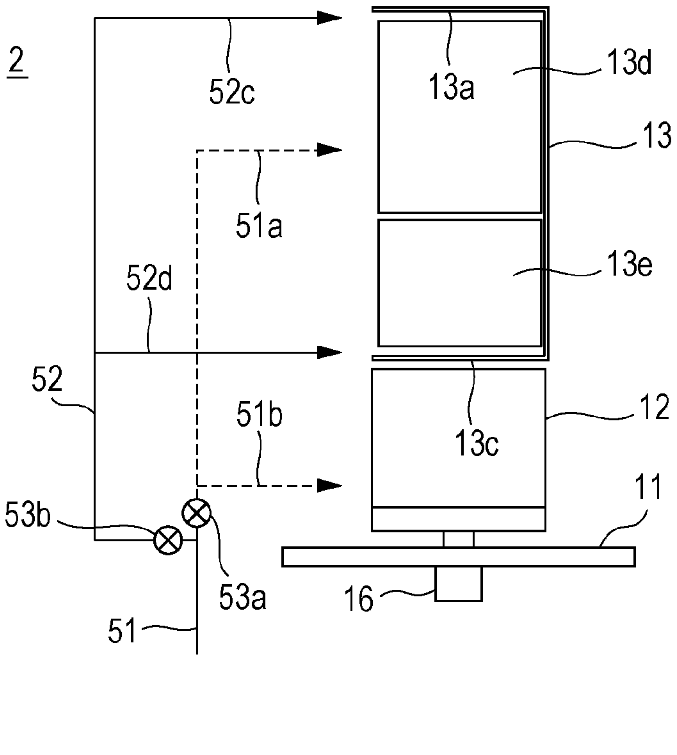

FIGS. 7A and 7B schematically illustrate a third modified example of the embodiments of the present disclosure. In the third modified example, the cooling gas nozzle (which corresponds to the cooling gas nozzle 39 of the embodiments described above) includes a first cooling gas nozzle 51 and a second cooling gas nozzle 52 branching from the first cooling gas nozzle 51. The first cooling gas nozzle 51 includes a first branch nozzle 51$a$ that is bent and extends toward the boat 13, a second branch nozzle 51$b$ that branches toward the boat 13 on the upstream side of the first branch nozzle 51$a$, and a switching valve 53$a$ provided on the upstream side of the second branch nozzle 51$b$, and the second cooling gas nozzle 52 branches in a predetermined direction from the first cooling gas nozzle 51 on the upstream side of the switching valve 53$a$.

The second cooling gas nozzle 52 includes a third branch nozzle 52$c$ that is bent and extends on the downstream side of the first branch nozzle 51$a$, a fourth branch nozzle 52$d$ that branches toward the boat 13 on the upstream side of the third branch nozzle 52$c$ and the first branch nozzle 51$a$ and on the downstream side of the second branch nozzle 51$b$, and a switching valve 53$b$ provided on the upstream side of the fourth branch nozzle 52$d$.

In the third modified example, the cooling gas jetting out from the first branch nozzle 51$a$ is supplied to the region between the top plate 13$a$ and the uppermost wafer among the wafers W in the substrate holding region at the reference position, and the cooling gas jetting out from the second branch nozzle 51$b$ is supplied to the region between the bottom plate 13$c$ and the lowermost wafer among the wafers W in the substrate holding region at the reference position. The cooling gas jetting out from the third branch nozzle 52$c$ is supplied to a region between the top plate 13$a$ and the uppermost wafer among the wafers W in the substrate holding region at the raised position, and the cooling gas jetting out from the fourth branch nozzle 52$d$ is supplied to the region between the bottom plate 13$c$ and the lowermost wafer among the wafers W in the substrate holding region at the raised position.

In the third modified example, in the first cooling step, the switching valve 53$a$ is opened, and the degree of opening of the switching valve 53$b$ is adjusted so that the flow rate of the cooling gas supplied to the second cooling gas nozzle 52 is less than the flow rate of the cooling gas supplied to the first cooling gas nozzle 51. Note that, the total flow rate of the cooling gas in the first cooling step may be set to 75 slm, and the flow rate ratio between the cooling gas of the first cooling gas nozzle 51 and the cooling gas of the second cooling gas nozzle 52 may be set to 5:1, for example.

In the second cooling step, the switching valve 53$a$ is closed, the switching valve 53$b$ is opened, and the flow rate of the cooling gas is set to be less than the flow rate of the cooling gas in the first cooling step. For example, the total flow rate of the cooling gas in the second cooling step may be set to 15 slm. That is, in the first cooling step, the cooling gas of a large flow rate jets out from the first branch nozzle 51$a$ and the second branch nozzle 51$b$, and the cooling gas of a small flow rate jets out from the third branch nozzle 52$c$ and the fourth branch nozzle 521$d$. In the second cooling step, the cooling gas of the small flow rate jets out only from the third branch nozzle 52$c$ and the fourth branch nozzle 52$d$ without ejecting the cooling gas through the first branch nozzle 51$a$ and the second branch nozzle 51$b$.

In the third modified example, in the second cooling step, the total flow rate of the cooling gas is set to be less than the total flow rate of the cooling gas in the first cooling step, so that it is possible to suppress the amount of consumption of the cooling gas.

Figure 8A:
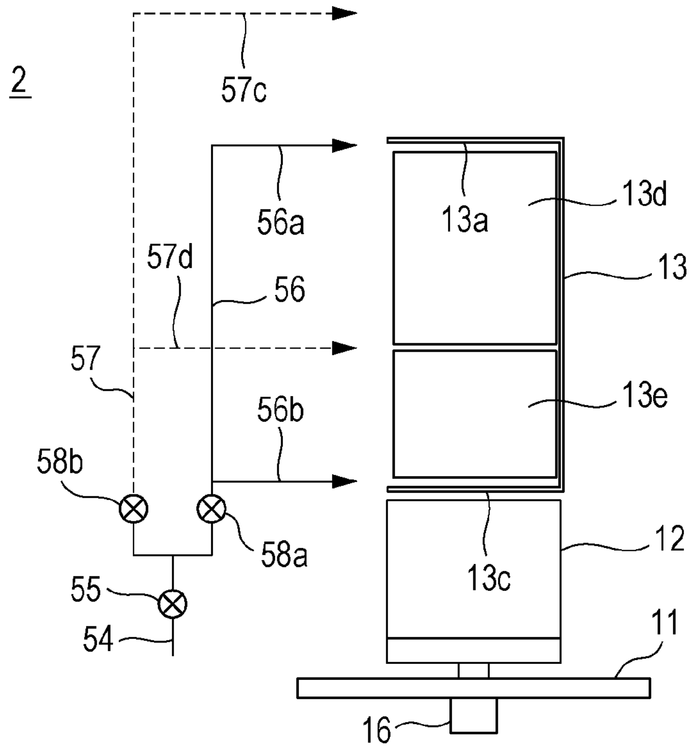
FIGS. 8A and 8B are longitudinal sectional views illustrating a schematic configuration of a transfer chamber of the substrate processing apparatus according to a fourth modified example of the embodiments of the present disclosure, in which FIG. 8A schematically illustrates the transfer chamber when the boat is located at the reference position, and FIG. 8B schematically illustrates the transfer chamber when the boat is located at the raised position.
Figure 8B:
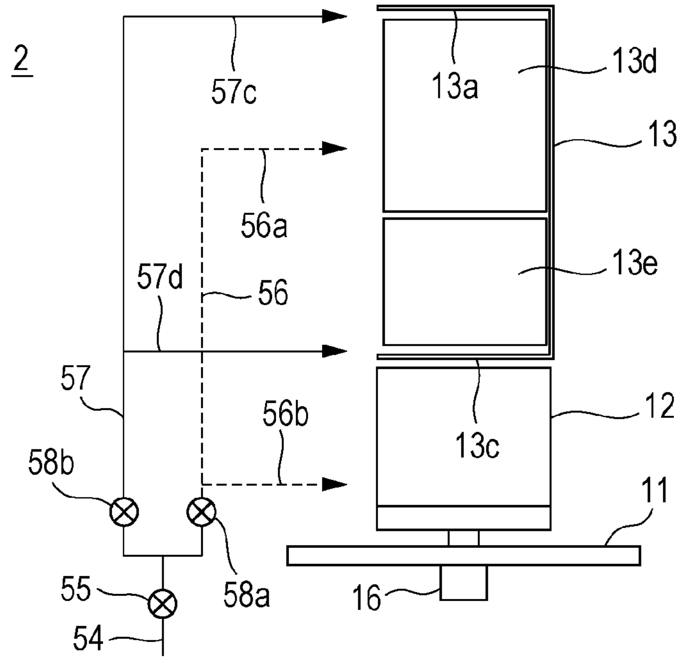

FIGS. 8A and 8B schematically illustrate a fourth modified example of the embodiments of the present disclosure. In the fourth modified example, a cooling gas nozzle 54 (which corresponds to the cooling gas nozzle 39 of the embodiments described above) includes a flow rate adjusting valve 55, and branches into a first cooling gas nozzle 56 and a second cooling gas nozzle 57 on the downstream side of the flow rate adjusting valve 55. The first cooling gas nozzle 56 includes a first branch nozzle 56*a* that is bent and extends toward the boat 13, a second branch nozzle 56*b* that branches toward the boat 13 on the upstream side of the first branch nozzle 56*a*, and a first electromagnetic valve 58*a* provided on the upstream side of the second branch nozzle 561*b*. The second cooling gas nozzle 57 includes a third branch nozzle 57*c* that is bent and extends toward the boat 13 on the downstream side of the first branch nozzle 56*a*, a fourth branch nozzle 57*d* that branches toward the boat 13 on the upstream side of the third branch nozzle 57*c* and the first branch nozzle 56*a* and on the downstream side of the second branch nozzle 56*b*, and a second electromagnetic valve 58*b* provided on the upstream side of the fourth branch nozzle 57*d*.

In the fourth modified example, the cooling gas jetting out from the first branch nozzle 56*a* is supplied to the region between the top plate 13*a* and the uppermost wafer among the wafers W in the substrate holding region at the reference position, and the cooling gas jetting out from the second branch nozzle 56*b* is supplied to the region between the bottom plate 13*c* and the lowermost wafer among the wafers W in the substrate holding region at the reference position. The cooling gas jetting out from the third branch nozzle 57*c* is supplied to the region between the top plate 13*a* and the uppermost wafer among the wafers W in the substrate holding region at the raised position, and the cooling gas jetting out from the fourth branch nozzle 57*d* is supplied to the region between the bottom plate 13*c* and the lowermost wafer among the wafers W in the substrate holding region at the raised position.

While the boat 13 moves up and down, the degree of opening of the flow rate adjusting valve 55 is controlled and opening and closing of the electromagnetic valves 58*a* and 58*b* are controlled, in synchronization with signals issued at the time of completion of movement to the reference position and completion of movement to the raised position.

When the movement of the boat 13 to the reference position is completed (that is, in the first cooling step), the degree of opening of the flow rate adjusting valve 55 is increased, the first electromagnetic valve 58*a* is opened, and the second electromagnetic valve 58*b* is closed. When the movement of the boat 13 to the raised position is completed (that is, in the second cooling step), the degree of opening of the flow rate adjusting valve 55 is reduced, the first electromagnetic valve 58*a* is closed, and the second electromagnetic valve 58*b* is opened. Further, while the boat 13 moves up and down (that is, in the stopping step), the flow rate adjusting valve 55 is closed and the electromagnetic valves 58*a* and 58*b* are closed.

In the fourth modified example, in the first cooling step, for example, 75 slm of the cooling gas is supplied to the first cooling gas nozzle 56, and the cooling gas of a large flow rate jets out only from the first branch nozzle 56*a* and the second branch nozzle 56*b* without ejecting the cooling gas through the third branch nozzle 57*c* and the fourth branch nozzle 571*d*. In the second cooling step, for example, 15 slm of the cooling gas is supplied to the second cooling gas nozzle 57, and the cooling gas of a small flow rate jets out only from the third branch nozzle 57*c* and the fourth branch nozzle 57*d* without ejecting the cooling gas through the first branch nozzle 56*a* and the second branch nozzle 56*b*.

Also in the fourth modified example, in the second cooling step, the total flow rate of the cooling gas is set to be less than that in the first cooling step, so that it is possible to suppress the amount of consumption of the cooling gas.

Figure 9:
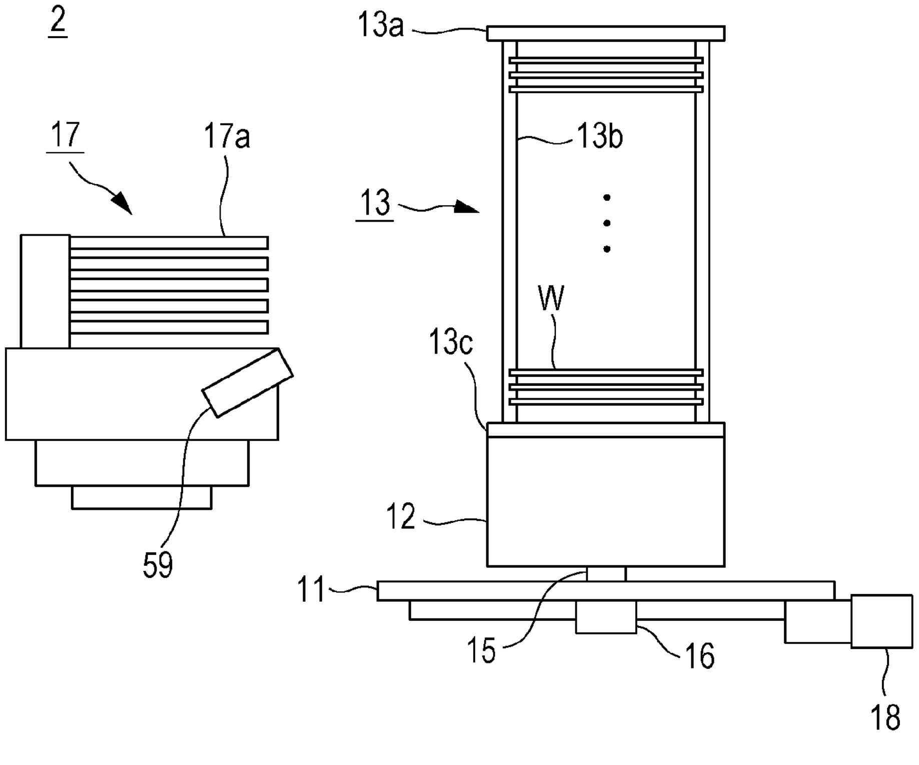
FIG. 9 is a longitudinal sectional view illustrating a schematic configuration of a transfer of the substrate processing apparatus chamber according to a fifth modified example of the embodiments of the present disclosure.

FIG. 9 schematically illustrates a fifth modified example of the embodiments of the present disclosure. In the fifth modified example, a thermometer 59 serving as a temperature sensor is provided on the leading end side of the substrate transfer machine 17. As the thermometer 59, for example, a radiation thermometer capable of measuring a temperature in a non-contact manner may be used.

Note that the thermometer 59 is capable of temperature measurement of all the wafers W loaded in the boat 13, for example, in a state where the boat 13 is at the raised position. For example, the measurement may be performed while the substrate transfer machine 17 is moved up and down as in the case of the wafer mapping, or the measurement may be performed by moving the substrate transfer machine 17 to a determined position in the substrate processing region in advance.

Figure 10:
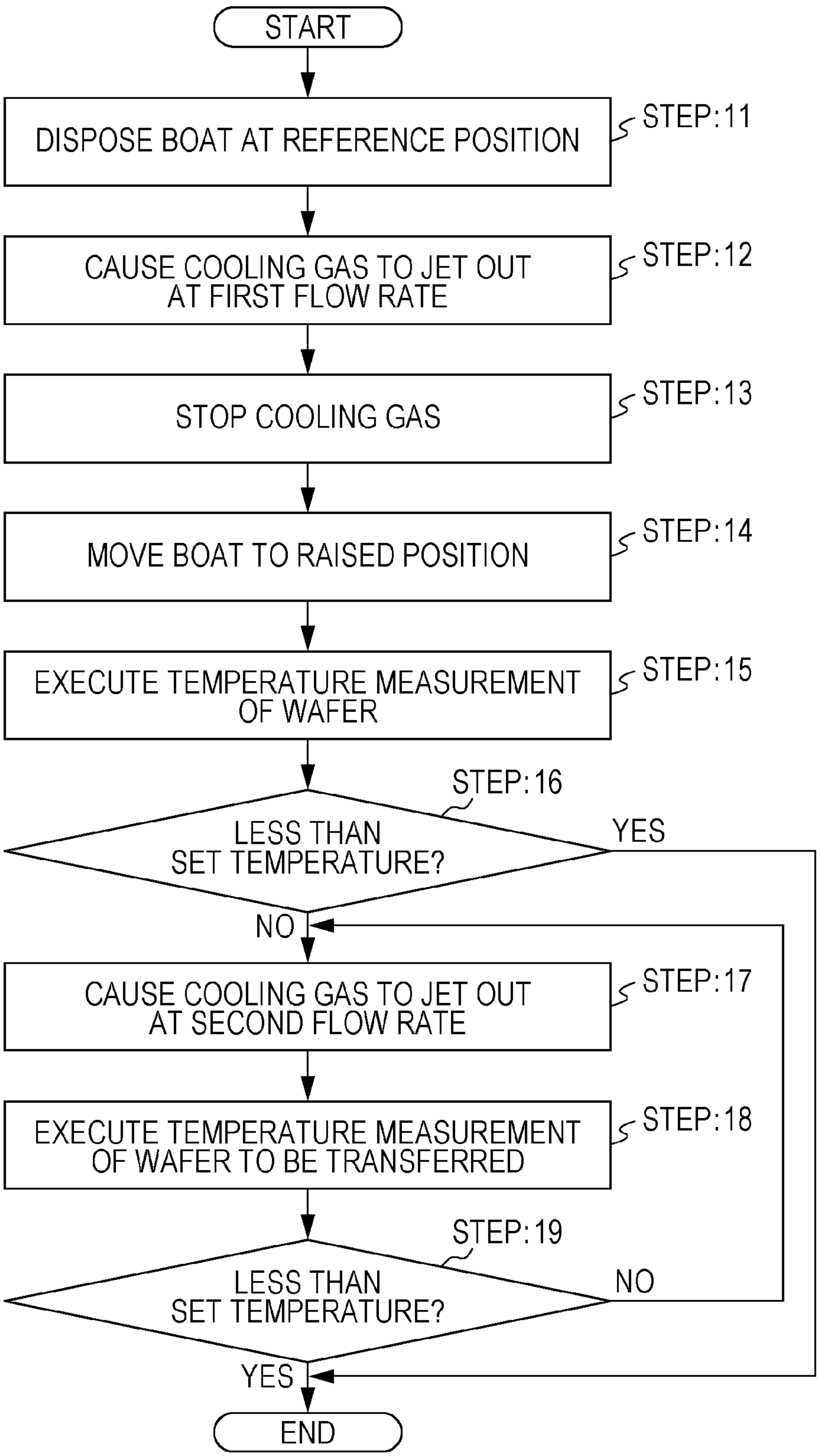
FIG. 10 is a flowchart schematically illustrating a cooling step of cooling the processed wafer in the transfer chamber according to the fifth modified example of the embodiments of the present disclosure.

Hereinafter, details of the cooling step for the wafer W in the fifth modified example will be described with reference to a flowchart of FIG. 10. Note that, in FIG. 10, STEP: S11 to STEP: S14 are similar to STEP: S01 to STEP: S04 in FIG. 4, and STEP: S06 is the cooling step similar to STEP: S17, so that the same portions are omitted, and the following will be focused on differences between the fifth modified example and the embodiments described above. Thus, STEPS: S15, S16, S18, and S19 of the fifth modified example will be described below.

<Step S15>

After the boat 13 moves from the reference position to the raised position, temperature measurement of the wafers W by the thermometer 59 is started, and the substrate transfer machine 17 is moved up and down with the thermometer 59 facing the boat 13. The thermometer 59 measures the temperatures of all the wafers W in a non-contact manner on the basis of radiation light from all the wafers W loaded in the boat 13.

<Step S16>

After the temperature measurement for all the wafers W, the controller 42 (see FIG. 1) compares each of the temperatures of all the wafers W for which the temperature measurement is performed with the pre-set temperature, and determines whether or not all the measurement results are lower than the pre-set temperature, for example, 100° C. When it is determined that at least one among the measured temperatures is equal to or higher than the pre-set temperature, the step S17 (which is the second cooling step similar to STEP: S06) is executed. In the second cooling step (that is, the step S17), the cooling gas may be supplied in a manner similar to the first modified example to the fourth modified example described above, but details are omitted.

<Step S17>

In a case where it is determined in STEP: S16 that at least one of the results of measurement of the temperatures of all the wafers W is equal to or higher than the pre-set temperature after the wafer temperature measurement in STEP: S15, STEP: S17 (that is, the second cooling step) similar to STEP: S06 is executed as described above. In addition, in a case where it is determined in STEP: S19 described later that at least one of the results of measurement of the temperatures of all the wafers W is equal to or higher than the pre-set temperature, STEP: S17 (second cooling step) is executed. At this time, in the second cooling steps at the second time and later, at least one of a flow rate of the cooling gas or a time for supplying the cooling gas may be changed as compared with the cooling step at the first time. For example, the flow rate of the cooling gas or the time for supplying the cooling gas may be changed depending on a difference from a pre-set temperature (for example, 100° C.).

<Step S18>

After completion of the second cooling step, the tweezer 17*a* of the substrate transfer machine 17 is moved to the vicinity of the wafer W to be transferred, and the temperature of the wafer W to be transferred is measured by the thermometer 59. Note that, in the temperature measurement after the second cooling step, it is not necessary to measure all the wafers W to be transferred, and it is sufficient that the wafer W provided in the lower portion of the boat 13 is measured. Preferably, the wafer W loaded at the lowest position of the boat 13 may be measured.

<Step S19>

In a case where the temperature of the wafer W to be transferred is lower than the pre-set temperature, the substrate transfer machine 17 starts to transfer the wafer W from the boat 13. In addition, in a case where the temperature of the wafer W to be transferred is higher than or equal to the pre-set temperature, the temperature measurement of the wafer W is continued, that is, the step S17 (that is, the second cooling step) and the step S18 are performed again. And the substrate transfer machine 17 starts to transfer the wafer W from the boat 13 when the temperature of the wafer W becomes lower than the pre-set temperature after performing the steps S17 and S18 again. Since the steps S18 and S19 are performed between the cooling step (second cooling step) and the transfer step described above, STEP: S18 and STEP: S19 are also referred to as a transfer preparation step.

In the fifth modified example, the thermometer 59 capable of measuring the temperature in a non-contact manner is provided, the temperature measurement is performed on the wafer W to be transferred before transfer from the boat 13, and the wafer W is transferred when the temperature of the wafer W is lower than the pre-set temperature. Thus, after completion of the first cooling step, presence or absence of reheating due to the radiant heat from the heat insulator 12 can be confirmed. As a result, it is possible to prevent the wafer W from being transferred to the substrate transfer machine 17 in a state where the temperature of the wafer W becomes higher than or equal to the pre-set temperature due to reheating, and it is also possible to prevent the tweezer 17*a* from being damaged by the radiant heat.

Note that, in a case where the wafer mapping is executed for all the wafers W with the temperature measurement for all the wafers W loaded in the boat 13, it is possible to further confirm the placement state of the wafers W with respect to the boat 13 in addition to the above-described effects.

The technique of the present disclosure is described in detail by way of the embodiments and the modified examples described above. However, the technique of the present disclosure is not limited thereto. The technique of the present disclosure may be modified in various ways without departing from the scope thereof.

According to the present embodiments, the boat 13 is moved from the reference position to the raised position as described above, but if not particularly necessary, the first cooling step of supplying the cooling gas toward the boat 13, the stopping step of stopping the supply of the cooling gas in the first cooling step, and the second cooling step of cooling at least the processed wafers W held in the lower portion of the substrate holding region of the boat 13 may be executed at the reference position. In the stopping step, either one of the wafer mapping or the temperature measurement of the wafer may be executed. Even in this case, it goes without saying that the effects of the present embodiments or the modified examples described above are obtained.

Note that the film type of a thin film produced on the substrate by the processing apparatus 1 according to the present embodiments are not particularly limited. For example, the processing apparatus 1 can also be applied to processing of forming various film types of thin films, such as a nitride film (SiN or the like), an oxide film (SiO or the like), a film containing metal, CVD, and PVD. In addition, processing of forming a thin film on the substrate may be, for example, annealing, oxidizing, nitriding, diffusing, or the like. Further, it goes without saying that the processing apparatus 1 according to the present embodiments can be applied not only to a semiconductor manufacturing apparatus but also to other processing apparatuses such as an apparatus for processing a glass substrate such as an LCD device.

As described above, according to some embodiments in the present disclosure, the cooling time for the processed substrate can be shortened.

What is claimed is:

1. A substrate processing method comprising:

a first cooling step of cooling a plurality of processed substrates by supplying a gas toward a substrate holder disposed at a first cooling position;

a second cooling step of cooling the plurality of processed substrates by supplying the gas toward the substrate holder disposed at a second cooling position above the first cooling position; and a transfer step of transferring the plurality of processed substrates in a substrate holding region of the substrate holder depending on a temperature of the plurality of processed substrates, after the first cooling step or the second cooling step, wherein the transfer step comprises:

transferring a portion of the plurality of processed substrates held by the substrate holder from the second cooling position into a pod, and transferring an other portion of the plurality of processed substrates held by the substrate holder from the first cooling position into the pod, further comprising:

measuring a temperature of the plurality of processed substrates held by the substrate holder at the second cooling position, wherein the temperature of each of the plurality of processed substrates placed in the substrate holding region is compared with a preset target temperature, and when a single processed substrate of the plurality of processed substrates is higher than the preset target temperature, the second cooling step is executed, and when the temperature of each of the processed substrates is lower than the preset target temperature, the second cooling step is configured to be omitted.

2. The substrate processing method of claim 1, wherein the substrate holding region includes an upper substrate holding region and a lower substrate holding region, and the method further comprises:

at the first cooling position, a first transfer step where the substrate is transferred to the upper substrate holding region of the substrate holder; and at the second cooling position, a second transfer step where the substrate is transferred to the lower substrate holding region of the substrate holder.

3. The substrate processing method of claim 1, wherein the second cooling position is the position at which a transfer of the substrate holder to the substrate holding region is started, and the first cooling position is the position at which the transfer of the substrate holder to the substrate holding region is completed.

4. The substrate processing method of claim 1, wherein the substrate holding region includes an upper substrate holding region and a lower substrate holding region, and the first cooling step further comprises:

supplying the gas to a top plate of the substrate holder, a bottom plate of the substrate holder, and a boundary between the upper substrate holding region and the lower substrate holding region.

5. The substrate processing method of claim 1, further comprising:

measuring a temperature of the plurality of processed substrates held by the substrate holder at the second cooling position, and wherein the second cooling step is performed until the temperature of the plurality of processed substrates held by the substrate holder reaches 100 °C.

6. The substrate processing method of claim 5, wherein the second cooling step is performed until the temperature of the plurality of processed substrates held by the substrate holder reaches a heat-resistant temperature of the pod.

7. The substrate processing method of claim 1, wherein the substrate holder comprises an insulating region below the substrate holding area, and in each of the first cooling position and the second cooling position, the gas is supplied to a boundary between the insulating region and the substrate holding region.

8. The substrate processing method of claim 7, wherein in the second cooling step, the gas is configured to be supplied to each of the substrate holding region, the insulating region of the substrate holder, and the boundary between the substrate holding region and the insulating region.

9. The substrate processing method of claim 8, wherein in the second cooling step, wherein the gas is configured to be supplied at a boundary between a bottom plate of the substrate holder and the substrate holding region of the substrate holder.

10. The substrate processing method of claim 1, wherein the second cooling step and the transfer step are repeatedly executed according to the temperature of the plurality of processed substrates.

11. The substrate processing method of claim 1, wherein a total flow rate of the gas in the second cooling step is smaller than the total flow rate of the gas in the first cooling step.

12. The substrate processing method of claim 1, wherein during the transferring the other portion of the plurality of processed substrates held by the substrate holder from the first cooling position into the pod, any remaining processed substrates held in the substrate holder are transferred from the substrate holder at the first cooling position to the pod.

13. The substrate processing method of claim 1, further comprises:

before the transfer step, a movement step of moving the substrate holder from the first cooling position to the second cooling position.

14. The substrate processing method of claim 1, further comprises:

before the transferring the other portion of the plurality of processed substrates held by the substrate holder from the first cooling position into the pod, a movement step of moving the substrate holder from the second cooling position to the first cooling position.

15. The substrate processing method of claim 1, wherein at each of the first cooling position and the second cooling position a transferred state of the plurality of processed substrates can be confirmed.

16. A method for manufacturing a semiconductor device comprising:

a step of processing the plurality of processed substrates held by the substrate holder using the substrate processing method according to any one of claim 1.

17. A non-transitory computer-readable recording medium containing a program that causes a substrate processing apparatus to execute:

a first cooling procedure of supplying gas toward a substrate holder positioned at a first cooling position to cool a plurality of processed substrates;

a second cooling procedure of supplying the gas toward the substrate holder positioned at a second cooling position located above the first cooling position to cool the plurality of processed substrates; and a transport procedure of transporting the plurality of processed substrates in a substrate holding region of the substrate holder, depending on a temperature of the plurality of processed substrates, after the first cooling procedure or the second cooling procedure, and wherein the transport procedure further includes:

unloading a portion of the plurality of processed substrates held by the substrate holder from the second cooling position into a pod, and transferring an other portion of the plurality of processed substrates held by the substrate holder from the first cooling position into the pod, further comprising:

measuring a temperature of the plurality of processed substrates held by the substrate holder at the second cooling position, wherein the temperature of each of the plurality of processed substrates placed in the substrate holding region is compared with a preset target temperature, and when a single processed substrate of the plurality of processed substrates is higher than the preset target temperature, the second cooling step is executed, and when the temperature of each of the processed substrates is lower than the preset target temperature, the second cooling step is configured to be omitted.

18. A substrate processing apparatus comprising:

a process chamber configured to process a substrate;

a boat elevator configured to raise and lower a substrate holder holding the substrate and convey the substrate holder to and from the process chamber;

a nozzle configured to supply a gas to cool the substrate in the process chamber, to create a processed substrate; and a controller configured to execute of a process of cooling the substrate held in the substrate holder, and to perform:

a first cooling process of supplying the gas toward the substrate holder placed at a first cooling position to cool a plurality of processed substrates, a second cooling process of supplying the gas toward the substrate holder placed at a second cooling position located above the first cooling position to cool the plurality of processed substrates, and a transport process of transporting the plurality of processed substrates in a substrate holding region of the substrate holder after the first cooling process or after the second cooling process, according to temperatures of the plurality of processed substrates, and further includes:

a process of unloading some of the plurality of processed substrates held in the substrate holder from the substrate holder at the second cooling position into a pod, and a process of unloading other portions of the plurality of processed substrates held in the substrate holder from the substrate holder at the first cooling position into the pod, further comprising:

measuring a temperature of the plurality of processed substrates held by the substrate holder at the second cooling position, wherein the temperature of each of the plurality of processed substrates placed in the substrate holding region is compared with a preset target temperature, and when a single processed substrate of the plurality of processed substrates is higher than the preset target temperature, the second cooling step is executed, and when the temperature of each of the processed substrates is lower than the preset target temperature, the second cooling step is configured to be omitted.

* * * * *